(12) United States Patent
Kabir et al.

(10) Patent No.: US 9,991,900 B1
(45) Date of Patent: Jun. 5, 2018

(54) DIGITAL TO ANALOG (DAC) CONVERTER WITH CURRENT CALIBRATION

(71) Applicant: NXP USA, INC., Austin, TX (US)

(72) Inventors: Mohammad Nizam Kabir, Tempe, AZ (US); Mariam Hoseini, San Mateo, CA (US); Brandt Braswell, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/666,738

(22) Filed: Aug. 2, 2017

(51) Int. Cl.
*H03M 1/66* (2006.01)
*H03M 1/10* (2006.01)

(52) U.S. Cl.
CPC ........... *H03M 1/1009* (2013.01); *H03M 1/66* (2013.01)

(58) Field of Classification Search
CPC .............................. H03M 1/1009; H03M 1/66
USPC .................................................. 341/144, 120
See application file for complete search history.

(56) References Cited

U.S. PATENT DOCUMENTS

| | | | |
|---|---|---|---|
| 5,153,592 A | 10/1992 | Fairchild et al. | |
| 5,451,946 A | 9/1995 | Smith et al. | |
| 5,684,482 A | 11/1997 | Galton | |
| 5,955,980 A | 9/1999 | Hanna | |
| 5,977,899 A | 11/1999 | Adams | |
| 6,489,905 B1 | 12/2002 | Lee et al. | |
| 6,507,296 B1* | 1/2003 | Lee | H03M 1/1004 341/120 |
| 7,076,384 B1 | 7/2006 | Radulov et al. | |
| 8,803,715 B2* | 8/2014 | Lai | H03M 1/1004 341/120 |
| 8,872,687 B1 | 10/2014 | Lin et al. | |
| 9,337,855 B2* | 5/2016 | Saripalli | H03M 1/1019 |
| 9,762,256 B2* | 9/2017 | Chandra | H03M 1/066 |

OTHER PUBLICATIONS

Chan, K., et al.; "Dynamic Element Matching to Prevent Nonlinear Distortion From Pulse-Shape Mismatches in High-Resolution DACs;" IEEE Journal of Solid-State Circuits vol. 43, Issue 9, pp. 2067-2078; DOI: 10.1109/JSSC.2008.2001931; Sep. 2008.

Clara, M., et al.; "A 1.5V 200MS/s 13b 25mW DAC with Randomized Nested Background Calibration in 0.13μm CMOS;" IEEE International Solid-State Circuits Conference, ISSCC Session 13, Digest of Technical Papers, pp. 250-600; 2007.

Cong, Y., et al.; "A 1.5-V 14-bit 100-MS/s self-calibrated DAC," IEEE Journal of Solid-State Circuits, vol. 38, No. 12, pp. 2051-2060, DOI: 10.1109/JSSC.2003.819163; Dec. 2003.

(Continued)

*Primary Examiner* — Brian Young

(57) ABSTRACT

A digital to analog converter convert digital data in binary format to thermometer bit vectors. A first set of the thermometer bit vectors corresponds to most significant bits of the digital data and a second set of the thermometer bit vectors corresponds to least significant bits of the digital data. Connections of first current sources corresponding to the first set of the thermometer bit vectors and second current sources corresponding to the second set of the thermometer bit vectors are dynamically and randomly alternated to a first output line and a second output line. Calibration current is applied to the second current sources so a total current of the second current sources and the calibration current is within a predetermined range of an average current of the first current sources.

20 Claims, 4 Drawing Sheets

(56) References Cited

OTHER PUBLICATIONS

Fishov, A., et al.; "Segmented mismatch-shaping D/A conversion;" Circuits and Systems, 2002; ISCAS 2002; IEEE International Symposium on Circuits and Systems; 2002, pp. IV-679-IV-682 vol. 4.; DOI: 10.1109/ISCAS.2002.1010547; Conference Date: May 26-29, 2002.

Lin, C., et al. A 10-b, 500-MSample/s CMOS DAC in 0.6 mm2; IEEE Journal of Solid-State Circuits; vol. 33, Issue: 12; DOI: 10.1109/4.735535; Dec. 1998.

Lin, W., et al.; "A 12-bit 40 nm Dac Achieving SFDR > 70 dB at 1.6 GS/s and IMD < -61dB at 2.8 GS/s With Demdrz Technique," in IEEE Journal of Solid-State Circuits, vol. 49, Issue 3, pp. 708-717; DOI: 10.1109/JSSC.2014.2301769; Mar. 2014.

Tsai, J. et al.; "A 14-bit 200MS/s current-steering DAC achieving over 82dB SFDR with digitally-assisted calibration and dynamic matching techniques;" International Symposium on VLSI Design, Automation, and Test (VLSI-DAT), 2012, pp. 1-4; DOI: 10.1109/VLSI-DAT.2012.6212594; Conference Date: Apr. 23-25, 2012.

\* cited by examiner

DIGITAL TO ANALOG (DAC) CONVERTER WITH CURRENT CALIBRATION

BACKGROUND

Field

This disclosure relates generally to digital-to-analog converters (DACs), and more specifically, to DACs with current calibration.

Related Art

Current-steering DACs are based on an array of matched current sources that are switched to the output. Many DACs are implemented using a segmented architecture in which a DAC is divided into two sub-DACs, one for the Most Significant Bits (MSBs) and one for the Least Significant Bits (LSBs). Thermometer coding is used in the MSBs where the accuracy is most needed. Because of the reduced number of bits of this segment, the size is considerably smaller than a fully thermometer coded design. The LSBs can either use a binary-weighted approach or the thermometer-coded approach. Therefore, a segmented architecture is able to leverage the monotonicity advantages of the thermometer-coded architecture while achieving a small area.

Dynamic element matching, and more specifically, dynamic element randomization is a known class of digital techniques used to randomize mismatch errors of unit elements of a DAC. While this improves dynamic performance of a DAC, the size of the randomizer grows exponentially with the number of bits of the DAC. With segmented DACs, randomization can be applied to the most significant sub-DACs or all sub-DACs having different weights. However, due to different weights (gain values) of each sub-DAC, the gain error (or boundary mismatch) between the sub-DACs still exists which degrades the dynamic performance. Therefore, a need exists for a DAC with improved performance at boundaries between sub-DACs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a DAC is sub-divided into two or more thermometer coded sub-DACs in which each sub-DAC is a unary array of current elements corresponding to a portion of bits of the digital input to the DAC. Each sub-DAC has a corresponding randomizer to reduce current mismatch within the sub-DAC. The sub-DACs corresponding to the lower significant bits of the digital input also includes one or more current calibration elements which may be used to ensure that the total current value of the sub-DACs corresponding to the lower significant bits is within a predetermined range of the average current value of the sub-DACs corresponding to the most significant bits. In this manner, performance is maintained even at the boundaries between the sub-DACs.

Figure 1:
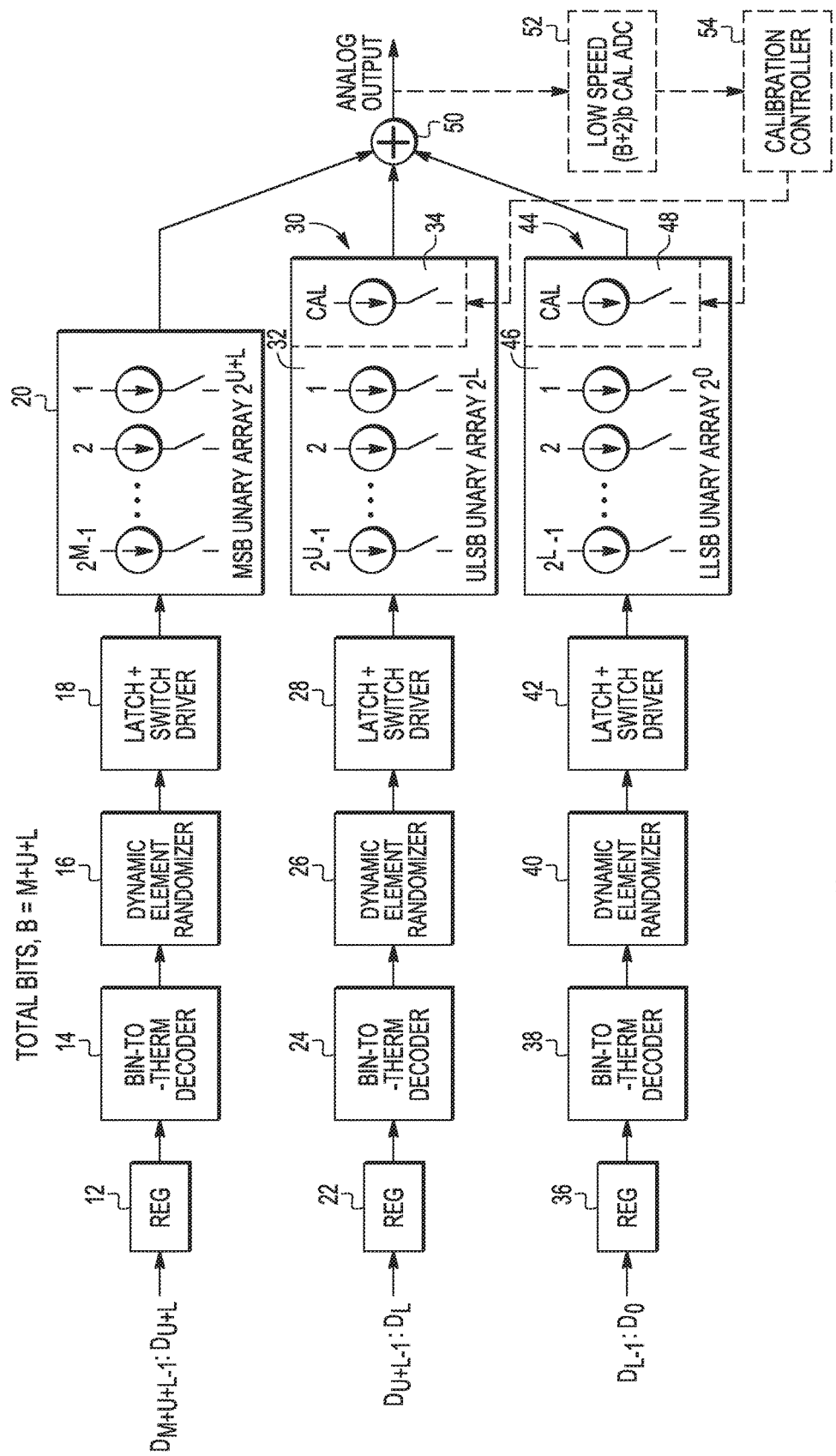
FIG. 1 illustrates, in block diagram form, a DAC having three sub-DACs in accordance with one embodiment of the present invention.

FIG. 1 illustrates, in block diagram form, and DAC 10 in accordance with one embodiment of the present invention. DAC 10 includes registers 12, 22, and 36, binary-to-thermometer decoders 14, 24, and 38, dynamic element randomizers 18, 28, and 42, unary arrays 20, 30, and 44, a summer 50, a calibration analog-to-digital converter (ADC) 52, and a calibration controller 54. DAC 10 receives a digital input value, D, having a total of B bits. These B bits includes M most significant bits (MSBs), U upper least significant bits (LSBs), and L lower LSBs, such that B=M+U+L. The MSBs, corresponding to D[(M+U+L−1):(U+L)], are stored to register 12. The upper LSBs, corresponding to D[(U+L−1):L], are stored to register 22. The lower LSBs, corresponding to D[(L−1):0], are stored to register 36. Each register 12, 22, 36 stores a corresponding portion of D and is coupled to provide the portion to corresponding binary-to-thermometer decoder 14, 24, and 38, respectively. Binary-to-thermometer decoders 14, 24, and 38 are coupled to corresponding dynamic element randomizer 16, 26, and 40, respectively, which are each coupled to latch and switch controller 18, 28, and 42, respectively.

Latch and switch controller 18 is coupled to MSB unary array 20 which includes $2^M-1$ current elements and provides an output to a first input of summer 50. Latch and switch controller 18 provides control signals to switches in array 20, as will be described below. Latch and switch controller 28 is coupled to upper LSB unary array 30 which includes $2^U-1$ current elements. A portion 32 of which are equally weighted current sources and a portion 34 of which are calibration current elements. Unary array 30 provides an output to a second input of summer 50. Latch and switch controller 28 provides control signals to switches in array 30. Latch and switch controller 18 is coupled to lower LSB unary array 44 which includes $2^L-1$ current elements. A portion 46 of which are equally weighted current sources and a portion 48 of which are calibration current elements. Unary array 44 provides an output to a third input of summer 50. Latch and switch controller 42 provides control signals to switches in array 44. Summer 50 provides an analog output of DAC 10. Calibration ADC 52 receives the output of summer 50 and provides information to calibration controller 54 based on the analog output. Calibration controller 54 provides outputs to control switches within portions 34 and 48 of unary arrays 30 and 44.

The binary to thermometer decoders convert binary data received inputs into thermometer coded data vectors. A thermometer coded data vector, T, includes, from the LSB of the vector towards the MSB of the vector, a number of asserted bits (i.e. 1's) equal to the input binary value. For example, assuming a 3-bit binary input, the thermometer coded data vector is a $2^3$-bit output. If the binary input is 0b010, then the thermometer coded data vector would be "00000011" with 2 asserted bits (1's) from the LSB towards the MSB. If the binary input is 0b110, then the thermometer coded data vector would be "00111111" with 6 asserted bits (1's) from the LSB towards the MSB. In a sub-DAC, each current element has an equal weight (i.e. gain), and the thermometer coded data vector corresponds to how many of the equal weighted current elements in the corresponding unary array of the sub-DAC to turn on (i.e. enable). Note that, in each sub-DAC, the current elements have a different weight than in the other sub-DACs, with increasing weight from lower LSB array 44 to upper LSB array 30, to MSB array 20.

For each sub-DAC, the thermometer coded data vector, T, is provided to a corresponding dynamic element randomizer (DEM) to produce a modified data vector, S. A barrel shifter in each dynamic element randomizer generates S, such that S(N)=G[T(N)] in which S(N) contains the same number of 0's and 1's as T(N) but in a different order based on the dynamic element randomization algorithm G. Due to this randomization, the static error resulting from mismatch of DAC elements is converted into wideband noise which results in improved performance. As seen in FIG. 1, each sub-DAC uses an independent DEM which reduces circuit overhead and complexity as compared to using a DEM for the full DAC. However, the DEM only addresses the mismatch within each sub-DAC, but not at the boundaries between sub-DACs. That is, a transition between sub-DACs, such as from an LSB sub-DAC to the MSB sub-DAC, still introduces the full variance caused by mismatch.

For example, referring to FIG. 1, each current element in the lower LSB array 44 may have a weight of 1 LSB, each current element in the upper LSB array has a weight of $2^L$, and each current element in the MSB array has a weight of $2^{U+L}$. At the boundary transition between the upper LSB array and each MSB element, all the current elements of the upper LSB array are on and all the current elements of the MSB array are off which then transitions to all the current elements of the upper LSB array turning off and one current element of the MSB array being on. This situation introduces the largest variance and is therefore most problematic and leads to inaccuracies in the DAC.

To address this problem, calibration current sources may be used to affect the total current value of the immediately lower sub-DAC so that the gap between the total current of the lower sub-DAC and the average current of the immediately higher sub-DAC is no more than a predetermined amount. That is, at the boundaries between sub-DACs, the gap between the total current on the lower sub-DAC and average current on the higher sub-DAC should achieve a desired accuracy to keep the gain error within acceptable limits. Therefore, measurements may be taken and used by calibration controller 54 and signals can be provided to calibrate portion 34 or calibrate portion 48 to turn on or off additional calibration current elements, as will be discussed in the examples below in references to FIGS. 2-4.

Referring back to FIG. 1, DAC 10 includes slow speed B+2 bit ADC 52 (in which B is the resolution of the DAC) and calibration controller 54 which are used to measure and correct the gain error between sub-DACs. The mean (average) weight of MSB sub-DAC is compared digitally with the total weight of the upper and lower LSB sub-DACs. The coarse correction is applied to the upper LSB sub-DAC and then fine adjustment can be done in the lower LSB sub-DAC by comparing total weight of the lower LSB sub-DAC with the average weight of the upper LSB sub-DAC. Note that ADC 52 measures the voltage of the analog output of DAC10, and in order to measure it accurately, it needs to have more bits than the DAC. Therefore, if DAC 10 is a 10-bit DAC, ADC 52 is a 12 bit ADC. Note also that the measurements may be done in the same chip as DAC 10 or may be done off-chip. For example, ADC 52 and portions of calibration controller 54 may not be located on the same integrated circuit as DAC 10, and the remaining portions of calibration controller 54 would include latches to store the switch configuration information of the calibration current elements.

Figure 2:
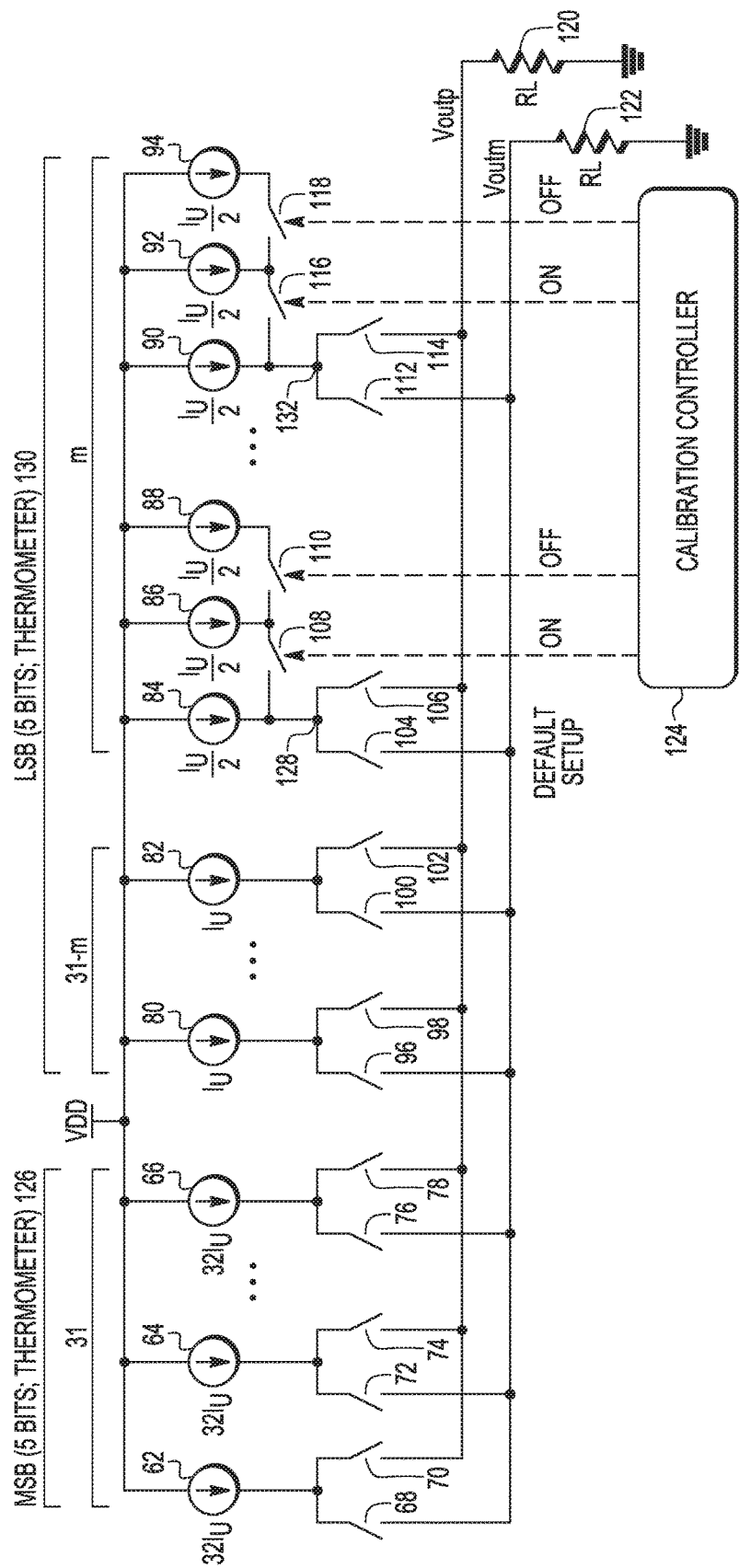
FIGS. 2-4 illustrate, in partial schematic form, a DAC having two sub-DACs in accordance with various embodiments of the present invention.

FIG. 2 illustrates an example of a 10-bit DAC 60 which is segmented into two thermometer sub-DACs, a 5-bit MSB sub-DAC 126 and a 5-bit LSB sub-DAC 130. Each section has 31 equally weighted current sources (i.e. current elements). In this example, the current sources 62, 64, . . . 66 of MSB 126 have an ideal weight of 80 microamps, and the current sources 80, . . . , 82 of LSB 130 have an ideal weight of 2.5 microamps. However, of the 31 LSB current sources, m current sources 84, 86, 88, . . . , 90, 92, and 94 are randomly selected to have a trim range, such as 0.5 of the LSB current source. In the illustrated example, the m current sources, by default, have 0.5 of the LSB current source (0.5 LSB) added to the output, and the total LSB current is "31*LSB current source" which is represented by (31-m)*LSB current source+m*(0.5 LSB+0.5 LSB). Current element 84 is connected between VDD and a node 128, and node 128 is coupled to Voutp via a switch 106 and to Voutm via a switch 104. Current element 90 is connected between VDD and a node 132, and node 132 is coupled to Voutp via a switch 114 and to Voutm via a switch 112. Current elements 86 and 88 are connected between VDD and node 128 via a corresponding switch, such as switches 108 and 110, and current elements 92 and 95 are connected between VDD and node 132 via a corresponding switch, such as switches 116 and 118. Switches 108 and 110 are controlled by calibration controller 124 to increment or decrement the default trim range of current element 84 and switches 116 and 118 are controlled by switch controller 124 to increment or decrement the default trim range of current element 90. In one embodiment, the value m is selected based on the needed calibration range and the value of the current sources.

Note that FIG. 2 is a specific example of DAC 10 of FIG. 1, but having only two sub-DACs rather than 3. Therefore, the 31-m current sources correspond to the unary arrays of FIG. 1, and the m current sources correspond to the calibration current elements of FIG. 1. Also, calibration controller 124 corresponds to calibration controller 54. In FIG. 2, each current source in MSB 126 is coupled to Voutp via a corresponding switch, such as switches 70, 74, . . . , and 78, and each current source in MSB 126 is coupled to Voutm via a corresponding switch, such as switches 68, 72, . . . , and 76. Based on the latched results of the dynamic element randomizer, switches 68, 70, 72, 74, . . . , 76, 78 are set accordingly (such as by the corresponding latch and switch driver). Current sources of LSB 130 are also coupled to Voutp via a corresponding switch, such as switches 98, . . . , 102, 106, and 114, and to Voutm via a corresponding switch, such as switches 96, . . . , 100, 104, and 112. For those current sources (i.e. current elements) that are selected to be enabled or turned on by the resulting randomized S vector generated in response to the input binary value, the switches connected between the current source and Voutp are closed and the switches connected between the current source and Voutm are open. For the remaining non-selected current sources, the switches connected between the current source and Voutm are closed and those between the current source and Voutp are open. Each of Voutp and Voutm are connected to loads RL 120 and RL 122, respectively. Therefore, Voutp and Voutm correspond to the analog output of DAC 60.

Referring to the example of FIG. 2, any of the m current sources can be enabled or turned on as needed by calibration controller 124 to ensure a desired accuracy of the gap between the total current value of LSB 130 is within an acceptable gap of the average current of MSB 126. In one embodiment, ADC 52 is used to measure the output of DAC 60 of MSB 126 when all the MSB current sources are on while all the LSB current sources are off and the output of DAC 60 of LSB 134 when all the LSB sources are on while all the MSB sources are off. To obtain the average weight of all MSB current sources, the measured value of the MSB is divided by the gain of the MSB section (which is 31 in a 5-bit segment). Ideally, the difference between the average weight of all MSBs and the sum of all LSBs equates to 1 LSB. If their measured values deviate from that, the total of all LSBs are adjusted to compensate for this difference. Based on the measured difference value, from the m current sources in LSB 130, increments of 0.5 LSB currents (trimmed by the trim elements), are added to or subtracted from the overall LSB currents to compensate for the gain error between MSB 126 and LSB 130. Each 0.5 LSB calibration currents source (such as sources 84 and 90) can therefore be connected to Voutp or Voutm as needed to adjust the total LSB current.

Figure 3:
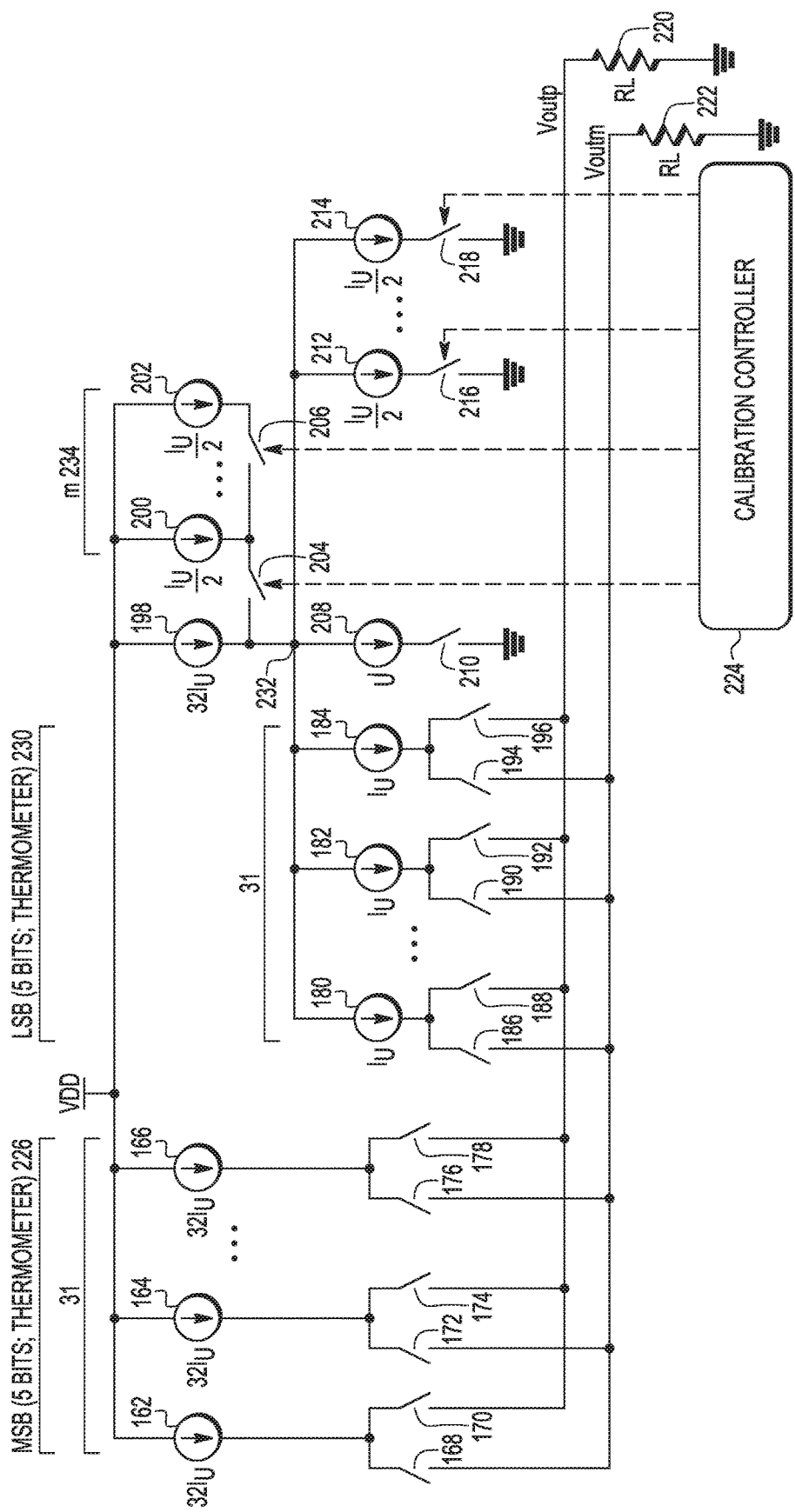

FIG. 3 illustrates another specific example of DAC 10 of FIG. 1, also having two sub-DACs rather than 3. FIG. 3 illustrates an example of a 10-bit DAC 160 which is segmented into two thermometer sub-DACs, a 5-bit MSB sub-DAC 226 and a 5-bit LSB sub-DAC 230. Each section has 31 equally weighted current sources (i.e. current element). In this example, the current sources 162, 164, . . . 166 of MSB 126 have equal weight and the current sources 180, . . . , 182, and 184 of LSB 230 have equal weight. In the example of FIG. 3, the current sources 180, . . . , 182, and 184 are generated from a large current source 198, equal in size to those current sources of MSB 226. Current source 208 is connected between current source 198 and ground to adjust the sum of all LSBs to be 1 LSB less than each MSB. Coupled to LSB 230 (and may be considered a part of LSB 230) are m calibration current sources, each having a value of 0.5 of the LSB current source. A first portion 234 of the m current sources are coupled between VDD and node 232 via a corresponding switch as switches 204 and 206. Therefore, as each switch is closed from left to right, current is added to node 232. The switches are controlled by calibration controller 224. A second portion 236 of the m current sources are coupled between node 232 and ground via a corresponding switch, such as switches 216 and 218. Therefore, as each switch is closed from left to right, current is subtracted from node 232. In this manner, the total current of LSB 230 can be adjusted such that the difference between the average weight of MSB 226 and total weight of LSB 230 is within the acceptable limit.

Similar to FIG. 2, depending on the output of the dynamic element randomizer, sets switches 168, 170, 172, 174, . . . , 176, 178, 186, 188, . . . , 190, 192, 194 and 196 accordingly to enable each selected source to provide current to Voutp. Those that are not selected are connected via the corresponding switches to Voutm. Voutp is connected to load RL 220 and Voutm is connected to load RL 222.

Figure 4:
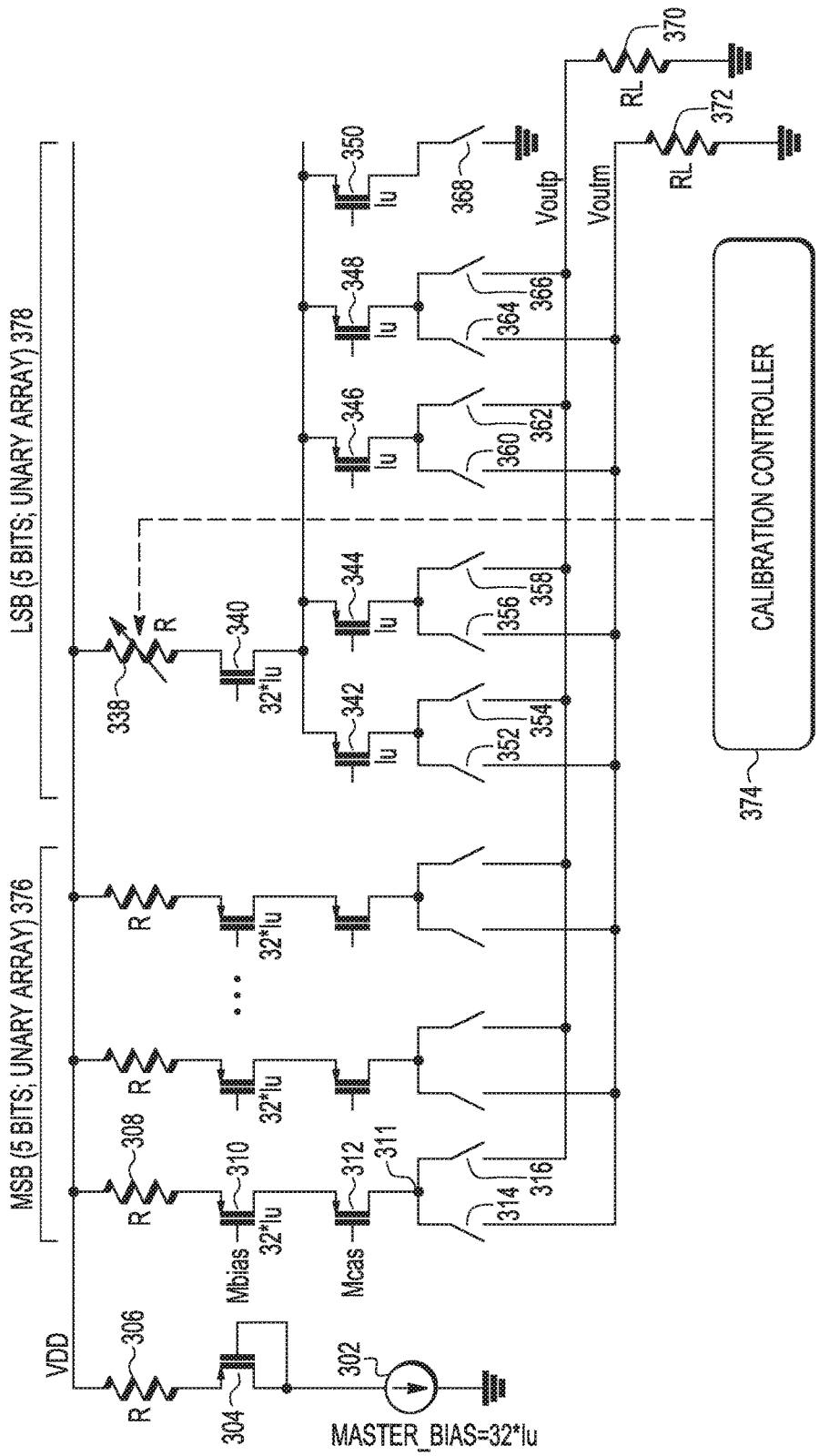

FIG. 4 illustrates another specific example of DAC 10 of FIG. 1, also having two sub-DACs rather than 3. FIG. 4 illustrates an example of a 10-bit DAC 160 which is segmented into two thermometer sub-DACs, a 5-bit MSB sub-DAC 376 and a 5-bit LSB sub-DAC 378. Each section has 31 equally weighted current sources (i.e. current element). In this example, each current source is formed with a current source and a cascode transistor whose gate is biased by Mcas. In the illustrated embodiment of FIG. 4, a resistor 306 is coupled between VDD and a first current electrode of a transistor 304, and a current source is coupled between a second current electrode of transistor 304 and ground. A control electrode (i.e. gate electrode) of transistor 304 is connected to the second current electrode of transistor 304 (i.e. drain). A resistor 308 is coupled between VDD and a first current electrode of a transistor 310, and a second current electrode of transistor 310 is coupled to a first current electrode of a transistor 312. A second current electrode of transistor 312 is coupled to a node 311, and node 311 is coupled to Voutp via a switch 316 and to Voutm via a switch 314. A control electrode (i.e. gate electrode) of transistor 310 is coupled to the control electrode of transistor 304, and a control electrode of transistor 312 is coupled to receive a bias voltage, Mcas.

A first current source of MSB 376 is formed by resistor 308, transistor 310, and transistor 312. Transistor 310 forms a current mirror with transistor 304 and cascode transistor 312 enhances the output impedance of transistor 310. Each current source in MSB 376 also includes a resistor, current mirror transistor, and transistor analogous to resistor 308, transistor 310, and transistor 312. Each current source is coupled via a corresponding switch to Voutp and via a corresponding switch to Voutm. Voutp is connected to load RL 370 and Voutm is connected to load RL 372

In LSB 378, current sources are formed by a resistor 338, a current mirror transistor 340, and m transistor branches, such as transistors 342, 344, . . . , 346, 348, and 350. Resistor 338 is a variable resistor whose resistance is set by calibration controller 374 which controls the amount of current provided by transistor 340 to the branches. The higher the resistance, the lower the current, and vice versa. Each branch transistor, except transistor 350, is coupled to Voutp via a corresponding switch (such as switches 354, 358, . . . , 362, and 366) and to Voutm via a corresponding switch (such as switches 352, 356, . . . , 360, and 364). Transistor 350 is coupled to ground via switch 368. The switches can selectively couple each current source of MSB 376 and LSB 378 to Voutp or Voutm, depending on the output of the corresponding dynamic element randomizer. Calibration controller 374 can adjust the total LSB current by adjusting the resistance of resistor 338. In this manner, the total LSB current can be adjusted to be within acceptable limits.

By now it should be appreciated that there has been provided a segmented thermometer DAC which is capable of using independent DEMs to address the mismatch within each sub-DAC and to use calibration current elements in lower sub-DACs to ensure the gain is within acceptable limits at the transitions at boundaries between the lower sub-DAC and neighboring higher sub-DAC. The ability to have independent DEMs for each sub-DAC allows for reduced circuit area as compared to having a DEM for the entire DAC. The calibration current sources add or subtract current from the total current of the lower sub-DAC to ensure that the total current of the lower sub-DAC is within a predetermined range of the average current of the higher sub-DAC. In this manner, improved DAC performance may be achieved.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" or "0b" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a DAC may be sub-divided into any number of thermometer coded sub-DAC segments, and is not limited to only 2 or 3 sub-DACs. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a digital to analog converter (DAC) includes a first sub-DAC configured to convert most significant bits (MSBs) of digital input data and a second sub-DAC configured to convert at least some least significant bits (LSBs) of the digital input data. The first sub-DAC includes a first array of current sources, first dynamic element randomizer circuitry configured to generate a first randomly modified data vector from a first thermometer coded data vector derived from the digital input data, and a first switch driver that controls coupling of the first array of current sources to a first output line or a second output line of the DAC based on the first randomly modified data vector. The second sub-DAC includes a second array of current sources including a calibration current source, second dynamic element randomizer circuitry configured to generate a second randomly modified data vector from a second thermometer coded data vector derived from the digital input data, and a second switch driver that controls coupling of the second array of current sources to the first output line or the second output line of the DAC based on the second randomly modified data vector. In one aspect of this embodiment, the DAC further includes a third sub-DAC configured to convert other LSBs that are not converted by the second sub-DAC, the third sub-DAC includes a third array of current sources including a calibration current source, second dynamic element randomizer circuitry configured to generate a third randomly modified data vector from a third thermometer coded data vector derived from the digital input data, and a third switch driver that controls coupling of the third array of current sources to the first output line or the second output line of the DAC based on the third randomly modified data vector. In another aspect, the DAC further includes a first binary to thermometer decoder configured to convert the MSBs of digital input data from binary format to the first thermometer coded data vector; a second binary to thermometer decoder configured to convert the at least some LSBs of digital input data from binary format to the second thermometer coded data vector. In a further aspect, the DAC further includes a third binary to thermometer decoder configured to convert the other LSBs of digital input data from binary format to the third thermometer coded data vector. In another aspect of this embodiment, the first array of current sources includes a first switch; a second switch; a current source for each bit of the MSBs, each current source for each bit in the MSBs including a first terminal connected to a first voltage supply (VDD) and a second terminal connected to a first terminal of the first switch and a first terminal of the second switch, wherein the second terminal of the first switch is connected to the first output line, the second terminal of the second switch is connected to the second output line, and the first switch driver controls the first and second switches to couple the current source to the first output line or the second output line. In a further aspect, the second array of current sources includes a first switch; a second switch; a current source for each bit of the at least some LSBs, each current source for each bit in the at least some LSBs including a first terminal connected to the first voltage supply (VDD) and a second terminal connected to a first terminal of the first switch and a first terminal of the second switch, wherein the second terminal of the first switch is connected to the first output line, the second terminal of the second switch is connected to the second output line, and the second switch driver controls the first and second switches to couple the current source for each bit in the at least some LSBs to the first output line or the second output line. In another further aspect, the third array of current sources includes a first switch; a second switch; a third switch; at least two current sources for each bit in the other LSBs, a first current source of the at least two current sources for each bit in the other LSBs including a first terminal connected to a first voltage supply (VDD) and a second terminal connected to a first terminal of the first switch and a first terminal of the second switch, wherein the second terminal of the first switch is connected to the first output line, the second terminal of the second switch is connected to the second output line, and the third switch driver controls the first and second switches to couple the current source for each bit in the other LSBs to the first output line or the second output line; the calibration current circuitry includes a second current source of the at least two current sources for each bit in the other LSBs and includes a first terminal connected to the first voltage supply (VDD) and a second terminal connected to a first terminal of the third switch, a second terminal of the third switch is connected to the second terminal of the first current source; a calibration controller configured to control the third switch to connect or disconnect the second terminal of the second current source to the second terminal of the first current source. In a further aspect, the at least two current sources for each bit in the other LSBs provide less current than current sources in the first and second arrays of current sources. In yet another aspect of this embodiment, the first sub-DAC further includes a thermometer decoder configured to receive a first portion of the digital input data in binary format and provide the MSBs with the number of MSBs set to 1 equal to the first portion of the digital input data starting at bit 0; the second sub-DAC further includes a thermometer decoder configured to receive a second portion of the digital input data in binary format and provide the at least some LSBs with the number of the at least some LSBs set to 1 equal to the second portion of the digital input data starting at bit 0. In another aspect, each of the MSBs correspond to one of the current sources in the first array of current sources; and each of the at least some of the LSBs correspond to one of the current sources in the second array of current sources. In a further aspect, the second array of current sources includes a first switch; a second switch; a current source for each bit in the at least some of the LSBs, each current source including a first terminal connected to a node and a second terminal connected to a first terminal of the first switch and a first terminal of the second switch, wherein the second terminal of the first switch is connected to the first output line, the second terminal of the second switch is connected to the second output line. In a further aspect, the calibration current circuitry includes a first set of current sources coupled between the node and ground via corresponding switches; a second set of current sources including first terminals connected to the first voltage supply and second terminals couplable to the node via corresponding switches. In yet a further aspect, the DAC further includes a calibration controller configured to control the switches corresponding to the first and second sets of current sources to connect or disconnect current sources in the first and second sets of current sources to the node independently of one another. In another further aspect, the current source for each bit in the at least some of the LSBs provides a same amount of current; current sources in the first and second sets of current sources in the calibration current circuitry each provide half an amount of current as the current source for each bit in the at least some of the LSBs. In another further aspect, the DAC further includes a diode coupled transistor, wherein each current source for each bit in the MSBs includes a first transistor with a gate electrode coupled to a gate electrode of the diode coupled transistor and a second transistor having a biased gate electrode. In another further aspect, the calibration current circuitry includes a variable resistor having one terminal coupled to the supply voltage; the current source for each bit in the at least some LSBs includes a current mirror coupled to another terminal of the variable resistor and a set of transistors, wherein each transistor in the set of transistors includes a cascode transistor, a first control electrode coupled to the current mirror, and a second electrode coupled to a first terminal of a first switch and a first terminal of a second switch, the second terminal of the first switch is connected to the first output line, the second terminal of the second switch is connected to the second output line, and the second switch driver controls the first and second switches to couple the current source for each bit in the at least some LSBs to the first output line or the second output line.

In another embodiment, a method of converting digital data to analog data includes converting the digital data in binary format to thermometer bit vectors, wherein a first set of the thermometer bit vectors corresponds to most significant bits of the digital data and a second set of the thermometer bit vectors corresponds to least significant bits of the digital data; dynamically and randomly alternating connections of first current sources corresponding to the first set of the thermometer bit vectors to a first output line and a second output line; dynamically and randomly alternating connections of second current sources corresponding to the second set of the thermometer bit vectors to the first output line and the second output line; applying calibration current to the second current sources so a total current of the second current sources and the calibration current is within a predetermined range of an average current of the first current sources. In one aspect, the first current sources include a current source for each of the MSBs, and the second current sources include a current source for each of the LSBs. In a further aspect, the first current sources and the second current sources have equal weight, and the calibration current is generated by current sources that have one half the weight of the first and second current sources. In another aspect, the method further includes measuring output of the DAC in an analog to digital converter (ADC), wherein the ADC is coupled to a calibration controller, and the calibration controller is coupled to control switches connected to calibration current sources that generate the calibration current.

What is claimed is:
1. A digital to analog converter (DAC) comprising:
  a first sub-DAC configured to convert most significant bits (MSBs) of digital input data, the first sub-DAC including:
    a first array of current sources,
    first dynamic element randomizer circuitry configured to generate a first randomly modified data vector from a first thermometer coded data vector derived from the digital input data, and
    a first switch driver that controls coupling of the first array of current sources to a first output line or a second output line of the DAC based on the first randomly modified data vector;
  a second sub-DAC configured to convert at least some least significant bits (LSBs) of the digital input data, the second sub-DAC including:

a second array of current sources including a calibration current source,
second dynamic element randomizer circuitry configured to generate a second randomly modified data vector from a second thermometer coded data vector derived from the digital input data, and
a second switch driver that controls coupling of the second array of current sources to the first output line or the second output line of the DAC based on the second randomly modified data vector;
a first binary to thermometer decoder configured to convert the MSBs of digital input data from binary format to the first thermometer coded data vector;
a second binary to thermometer decoder configured to convert the at least some LSBs of digital input data from binary format to the second thermometer coded data vector.

2. A digital to analog converter (DAC) comprising:
a first sub-DAC configured to convert most significant bits (MSBs) of digital input data, the first sub-DAC including:
  a first array of current sources,
  first dynamic element randomizer circuitry configured to generate a first randomly modified data vector from a first thermometer coded data vector derived from the digital input data, and
  a first switch driver that controls coupling of the first array of current sources to a first output line or a second output line of the DAC based on the first randomly modified data vector;
a second sub-DAC configured to convert at least some least significant bits (LSBs) of the digital input data, the second sub-DAC including:
  a second array of current sources including a calibration current source,
  second dynamic element randomizer circuitry configured to generate a second randomly modified data vector from a second thermometer coded data vector derived from the digital input data, and
  a second switch driver that controls coupling of the second array of current sources to the first output line or the second output line of the DAC based on the second randomly modified data vector;
a third sub-DAC configured to convert other LSBs that are not converted by the second sub-DAC, the third sub-DAC including:
  a third array of current sources including a calibration current source,
  second dynamic element randomizer circuitry configured to generate a third randomly modified data vector from a third thermometer coded data vector derived from the digital input data, and
  a third switch driver that controls coupling of the third array of current sources to the first output line or the second output line of the DAC based on the third randomly modified data vector.

3. The DAC of claim 2 further comprising:
a third binary to thermometer decoder configured to convert the other LSBs of digital input data from binary format to the third thermometer coded data vector.

4. A digital to analog converter (DAC) comprising:
a first sub-DAC configured to convert most significant bits (MSBs) of digital input data, the first sub-DAC including:
  a first array of current sources,
  first dynamic element randomizer circuitry configured to generate a first randomly modified data vector from a first thermometer coded data vector derived from the digital input data, and
  a first switch driver that controls coupling of the first array of current sources to a first output line or a second output line of the DAC based on the first randomly modified data vector;
a second sub-DAC configured to convert at least some least significant bits (LSBs) of the digital input data, the second sub-DAC including:
  a second array of current sources including a calibration current source, second dynamic element randomizer circuitry configured to generate a second randomly modified data vector from a second thermometer coded data vector derived from the digital input data, and
  a second switch driver that controls coupling of the second array of current sources to the first output line or the second output line of the DAC based on the second randomly modified data vector;
wherein the first array of current sources includes:
  a first switch;
  a second switch;
  a current source for each bit of the MSBs, each current source for each bit in the MSBs including a first terminal connected to a first voltage supply (VDD) and a second terminal connected to a first terminal of the first switch and a first terminal of the second switch, wherein
    the second terminal of the first switch is connected to the first output line,
    the second terminal of the second switch is connected to the second output line, and
    the first switch driver controls the first and second switches to couple the current source to the first output line or the second output line.

5. The DAC of claim 4 wherein the second array of current sources includes:
  a first switch;
  a second switch;
  a current source for each bit of the at least some LSBs, each current source for each bit in the at least some LSBs including a first terminal connected to the first voltage supply (VDD) and a second terminal connected to a first terminal of the first switch and a first terminal of the second switch, wherein
    the second terminal of the first switch is connected to the first output line,
    the second terminal of the second switch is connected to the second output line, and
    the second switch driver controls the first and second switches to couple the current source for each bit in the at least some LSBs to the first output line or the second output line.

6. The DAC of claim 2 wherein the third array of current sources includes:
  a first switch;
  a second switch;
  a third switch;
  at least two current sources for each bit in the other LSBs,
    a first current source of the at least two current sources for each bit in the other LSBs including a first terminal connected to a first voltage supply (VDD) and a second terminal connected to a first terminal of the first switch and a first terminal of the second switch, wherein the second terminal of the first switch is connected to the first output line, the second terminal of the second switch is connected to the second output line, and the third switch driver controls the first and second switches to couple the current source for each bit in the other LSBs to the first output line or the second output line;

the calibration current circuitry includes a second current source of the at least two current sources for each bit in the other LSBs and includes a first terminal connected to the first voltage supply (VDD) and a second terminal connected to a first terminal of the third switch, a second terminal of the third switch is connected to the second terminal of the first current source;

a calibration controller configured to control the third switch to connect or disconnect the second terminal of the second current source to the second terminal of the first current source.

7. The DAC of claim 6 wherein:

the at least two current sources for each bit in the other LSBs provide less current than current sources in the first and second arrays of current sources.

8. A digital to analog converter (DAC) comprising:

a first sub-DAC configured to convert most significant bits (MSBs) of digital input data, the first sub-DAC including:

a first array of current sources, first dynamic element randomizer circuitry configured to generate a first randomly modified data vector from a first thermometer coded data vector derived from the digital input data, and a first switch driver that controls coupling of the first array of current sources to a first output line or a second output line of the DAC based on the first randomly modified data vector;

a second sub-DAC configured to convert at least some least significant bits (LSBs) of the digital input data, the second sub-DAC including:

a second array of current sources including a calibration current source, second dynamic element randomizer circuitry configured to generate a second randomly modified data vector from a second thermometer coded data vector derived from the digital input data, and a second switch driver that controls coupling of the second array of current sources to the first output line or the second output line of the DAC based on the second randomly modified data vector;

wherein:

the first sub-DAC further includes a thermometer decoder configured to receive a first portion of the digital input data in binary format and provide the MSBs with the number of MSBs set to 1 equal to the first portion of the digital input data starting at bit 0;

the second sub-DAC further includes a thermometer decoder configured to receive a second portion of the digital input data in binary format and provide the at least some LSBs with the number of the at least some LSBs set to 1 equal to the second portion of the digital input data starting at bit 0.

9. The DAC of claim 1 wherein:

each of the MSBs correspond to one of the current sources in the first array of current sources; and each of the at least some of the LSBs correspond to one of the current sources in the second array of current sources.

10. The DAC of claim 4 wherein:

the second array of current sources includes:

a first switch;

a second switch;

a current source for each bit in the at least some of the LSBs, each current source including a first terminal connected to a node and a second terminal connected to a first terminal of the first switch and a first terminal of the second switch, wherein the second terminal of the first switch is connected to the first output line, the second terminal of the second switch is connected to the second output line.

11. The DAC of claim 10 wherein:

the calibration current circuitry includes:

a first set of current sources coupled between the node and ground via corresponding switches;

a second set of current sources including first terminals connected to the first voltage supply and second terminals couplable to the node via corresponding switches.

12. The DAC of claim 11 further comprising:

a calibration controller configured to control the switches corresponding to the first and second sets of current sources to connect or disconnect current sources in the first and second sets of current sources to the node independently of one another.

13. The DAC of claim 11 wherein:

the current source for each bit in the at least some of the LSBs provides a same amount of current;

current sources in the first and second sets of current sources in the calibration current circuitry each provide half an amount of current as the current source for each bit in the at least some of the LSBs.

14. The DAC of claim 4, further comprising a diode coupled transistor, wherein:

each current source for each bit in the MSBs includes a first transistor with a gate electrode coupled to a gate electrode of the diode coupled transistor and a second transistor having a biased gate electrode.

15. The DAC of claim 4 wherein:

the calibration current circuitry includes a variable resistor having one terminal coupled to the supply voltage;

the current source for each bit in the at least some LSBs includes a current mirror coupled to another terminal of the variable resistor and a set of transistors, wherein each transistor in the set of transistors includes a cascode transistor, a first control electrode coupled to the current mirror, and a second electrode coupled to a first terminal of a first switch and a first terminal of a second switch, the second terminal of the first switch is connected to the first output line, the second terminal of the second switch is connected to the second output line, and the second switch driver controls the first and second switches to couple the current source for each bit in the at least some LSBs to the first output line or the second output line.

16. A method of converting digital data to analog data comprising:

converting the digital data in binary format to thermometer bit vectors, wherein a first set of the thermometer bit vectors corresponds to most significant bits of the digital data and a second set of the thermometer bit vectors corresponds to least significant bits of the digital data;

dynamically and randomly alternating connections of first current sources corresponding to the first set of the thermometer bit vectors to a first output line and a second output line;

dynamically and randomly alternating connections of second current sources corresponding to the second set of the thermometer bit vectors to the first output line and the second output line;

applying calibration current to the second current sources so a total current of the second current sources and the calibration current is within a predetermined range of an average current of the first current sources.

17. The method of claim 16 wherein:

the first current sources include a current source for each of the MSBs, and the second current sources include a current source for each of the LSBs.

18. The method of claim 17 wherein:

the first current sources and the second current sources have equal weight, and the calibration current is generated by current sources that have one half the weight of the first and second current sources.

19. The method of claim 16 further comprising:

measuring output of the DAC in an analog to digital converter (ADC), wherein the ADC is coupled to a calibration controller, and the calibration controller is coupled to control switches connected to calibration current sources that generate the calibration current.

20. The DAC of claim 8 wherein:

each of the MSBs correspond to one of the current sources in the first array of current sources; and each of the at least some of the LSBs correspond to one of the current sources in the second array of current sources.

* * * * *